(12) United States Patent  (10) Patent No.: US 8,315,584 B2
Oba  (45) Date of Patent: Nov. 20, 2012

(54) SEMICONDUCTOR INTEGRATED CIRCUIT AND BROADCAST RECEIVER

(75) Inventor: Yasuo Oba, Shiga (JP)

(73) Assignee: Panasonic Corporation, Osaka (JP)

( * ) Notice: Subject to any disclaimer, the term of this patent is extended or adjusted under 35 U.S.C. 154(b) by 83 days.

(21) Appl. No.: 13/085,794

(22) Filed: Apr. 13, 2011

(65) Prior Publication Data

US 2011/0188608 A1   Aug. 4, 2011

Related U.S. Application Data

(63) Continuation of application No. PCT/JP2009/004944, filed on Sep. 28, 2009.

(30) Foreign Application Priority Data

Apr. 28, 2009 (JP) ................................. 2009-109658

(51) Int. Cl.
  *H04B 1/10* (2006.01)

(52) U.S. Cl. .......................... 455/310; 455/254; 455/283

(58) Field of Classification Search .................. 455/137, 455/254, 271, 283, 287, 302, 303, 310, 296
See application file for complete search history.

(56) References Cited

U.S. PATENT DOCUMENTS

| 5,155,570 A | 10/1992 | Tomizuka et al. |
| 2005/0233721 A1 | 10/2005 | Sakurai |
| 2010/0109955 A1* | 5/2010 | Anguera et al. ............... 343/702 |

FOREIGN PATENT DOCUMENTS

| JP | 09-069798 | 3/1997 |
| JP | 11-027160 | 1/1999 |
| JP | 2004-260428 | 9/2004 |
| JP | 2006-042054 | 2/2006 |

* cited by examiner

*Primary Examiner* — Christian Hannon
(74) *Attorney, Agent, or Firm* — McDermott Will & Emery LLP

(57) ABSTRACT

A semiconductor integrated circuit for broadcast receivers, which integrates an RF circuit, a mixer, an IF circuit, and an intermediate-frequency signal processing circuit onto a single chip, additionally includes a second RF circuit whose input terminal is grounded through an impedance equivalent to or almost the same as the output impedance of an antenna circuit, and a second mixer downstream of the second RF circuit. The second RF circuit and the second mixer each has an input impedance equivalent to that of the received signal subsystem; therefore, a spurious component equivalent to the spurious component contained in the output signal of the received signal subsystem is detected in the second RF circuit and in the second mixer, and cancels out the spurious component contained in the output signal of the received signal subsystem. Accordingly, the effects of noise due to spurious can be effectively reduced.

8 Claims, 7 Drawing Sheets

(a) OUTPUT OF FIRST MIXER
(b) OUTPUT OF SECOND MIXER
(c) COMBINED OUTPUT OF FIRST AND SECOND MIXERS

SEMICONDUCTOR INTEGRATED CIRCUIT AND BROADCAST RECEIVER

CROSS-REFERENCE TO RELATED APPLICATION

This is a continuation of PCT International Application PCT/JP2009/004944 filed on Sep. 28, 2009, which claims priority to Japanese Patent Application No. 2009-109658 filed on Apr. 28, 2009. The disclosures of these applications including the specifications, the drawings, and the claims are hereby incorporated by reference in its entirety.

BACKGROUND

The present invention relates to a solution to reduce a noise output due to spurious generated in a semiconductor integrated circuit (hereinafter also abbreviated as "IC") used in a broadcast receiver.

In recent years, as semiconductor integrated circuit technology has advanced, radio-frequency (RF), intermediate-frequency (IF), and baseband signal processing functions required for a receiver tend to be integrated onto a single IC chip. For example, a digital broadcast receiver for a broadcast service called "One Seg," incorporated in a mobile phone, integrates components ranging from an RF circuit to an OFDM demodulation section onto a same IC, thereby facilitating a further size reduction.

However, integration of these functions onto a single IC chip has caused unwanted emission (spurious) generated in the IC to be introduced into an RF amplifier circuit etc., in addition to a received signal, thereby producing a significant effect on the reception function. Conventionally, a superheterodyne architecture has caused a degradation in reception performance due to a beat output etc. by an IF signal generated from an output of a local oscillator and a received signal. To make matters worse, with an increase in the integration degree, a beat component between an oscillator signal of a crystal oscillator, used as an internal reference signal source, and an output of a local oscillator, and in addition, a noise component due to a logic signal caused by integration of a logic circuit onto a same chip, may be introduced to the RF circuit, thereby causing a degradation in receiver sensitivity etc. Therefore, the quality of the device as a receiver may be significantly degraded, and thus there has been a strong need to reduce such noise due to spurious.

A conventional semiconductor integrated circuit for a receiver is described below using FIG. 9.

FIG. 9 is a block diagram of a semiconductor integrated circuit used for a conventional receiver.

In FIG. 9, reference numeral 1 denotes an antenna circuit, including a tuner circuit or a filter circuit, a gain adjustment circuit, and a matching circuit. Reference numeral 2 denotes an RF circuit, including a low noise amplifier or a gain control amplifier etc. Reference numeral 3 denotes a mixer; 5, an IF signal or a baseband signal processing circuit; 6, a local oscillator circuit; 7, a frequency divider; 8, a PLL circuit; and 17, an oscillator which generates a reference frequency signal used in the PLL circuit 8 etc., and the oscillator is usually implemented by a crystal oscillator. Reference numeral 12 denotes an input terminal; 18, an output terminal; and 200, a digital signal processing circuit for demodulation, which demodulates a baseband signal by analog or digital signal processing, and outputs the result to a downstream component. Reference numeral 100 denotes an IC including all of the component circuits described above. Note that the RF circuit 2 and the digital signal processing circuit for demodulation 200 may be included in or disposed on a chip other than the IC 100.

FIG. 10 illustrates a schematic layout on a conventional IC chip.

In FIG. 10, reference numeral 31 denotes a received-signal input terminal; 44, a ground terminal; 32, a wire connecting the received-signal input terminal 31 to a bonding pad 33 on the IC chip 35; 33 and 45, bonding pads; 40, a line connecting the bonding pad 33 to a circuit block 36 on the IC chip 35; and 36, an RF signal block, including the RF circuit 2, the mixer 3, etc. of FIG. 9. Reference numeral 43 denotes a block which functions as a noise signal source, and is a crystal oscillator or a logic circuit etc. Reference numeral 35 denotes the IC chip; and 34, the IC package. Although the noise signal source block 43 is usually disposed spaced apart from the circuit block 36, a noise component propagates through a parasitic capacitive element etc. as is shown by arrows 38 and 39, and enter the circuit block 36. A dependence on the parasitic element allows noise to enter any part of the circuit block 36; however, the effect of noise is maximum when the noise enters the input terminal, in which case a high gain is provided at the signal output.

The operation of a conventional receiver configured as described above will now be described.

In FIG. 9, a broadcast signal is input through an antenna 11 to the antenna circuit 1, in which a desired frequency is selected and unwanted signals are filtered out, and then the broadcast signal is input through the input terminal 12 to the IC 100. The input broadcast signal (i.e., the received signal) is amplified or attenuated in the RF circuit 2, and then is input to the mixer 3. The mixer 3 extracts an IF signal having a desired signal bandwidth from an output from the local oscillator circuit 6 and from the received signal, and inputs the IF signal to the IF signal processing circuit 5. An output of the IF signal processing circuit 5 is input to the digital signal processing circuit for demodulation 200, which produces a video or audio signal etc. by demodulation. Meanwhile, an output of the local oscillator circuit 6 is input through the frequency divider 7 to the PLL circuit 8, which operates so as to obtain a local oscillation output having a desired frequency. Although the intermediate frequency IF is usually set to an out-of-baseband bandwidth frequency, the mixer 3 may directly generate a baseband signal.

Here, the RF circuit 2 and the mixer 3 may receive, in addition to the received signal input from the antenna circuit 1, an unwanted noise component (spurious component) generated in the IC 100 through a parasitic element in the IC 100. The spurious component is amplified and mixed together with the received signal to generate an IF signal, and the IF signal is demodulated in the digital signal processing circuit for demodulation 200; thus, the reception characteristic may be affected. Major sources of spurious noise include harmonic components contained in the output of the crystal oscillator 17 and switching noise from the logic circuit having a wide frequency range; and steps have previously been taken.

Patent Document 1 listed below describes technology in which blocks on an IC are arranged such that a noise source block and the RF block are disposed apart from each other, with an interference reduction block therebetween, in order to reduce interference.

However, although this conventional method allows the spurious to be reduced, a configuration in which a multitude of blocks are arranged on the IC chip of several millimeters square makes it difficult to completely remove the effects of parasitic components.

In addition, technology described in Patent Document 2 listed below changes the frequency of the local oscillation so that the frequency of the generated spurious will not fall within the receiving bandwidth in order to shift the IF frequency. However, although this method allows the effects of spurious to be reduced, a shift of the frequency of the IF signal results in a side effect of decrease in the reception characteristic (e.g., sensitivity, interference characteristic, etc.).

The referenced Patent Documents are as follows:
Patent Document 1: Japanese Examined Patent Publication No. H6-066415
Patent Document 2: Japanese Patent Publication No. 2006-042054

SUMMARY

Thus, in a conventional receiver IC for reducing spurious, a method to prevent interference between blocks by taking a step in terms of a block layout within a chip, such as the technology described in Patent Document 1, cannot completely remove the effects of spurious.

Meanwhile, as the example of Patent Document 2, a method to shift the IF frequency by changing the frequency of the local oscillation so that the frequency of the generated spurious will not fall within the receiving bandwidth has a problem in that a decrease in the reception characteristic is inevitable. Thus, there is a need for an effective method for reducing spurious with no decrease in characteristic.

An object of the present invention is to provide a receiver IC in which the effects of spurious can be removed almost completely.

In order to achieve the above object, the present invention adopts a configuration in which a spurious component equivalent to the spurious component contained in an output signal of the received signal subsystem is detected, and the spurious components are caused to cancel each other.

Specifically, a semiconductor integrated circuit according to the present invention includes a first RF circuit, coupled to an antenna circuit which receives a broadcast signal having a desired frequency, and configured to amplify or attenuate the broadcast signal, a local oscillator configured to generate a local oscillator signal having a frequency depending on the broadcast signal, a first mixer configured to receive the local oscillator signal of the local oscillator, and to convert an output of the first RF circuit into a predetermined intermediate-frequency signal or baseband signal, a second RF circuit whose input terminal is grounded through an impedance equivalent to or almost the same as an output impedance of the antenna circuit, a second mixer configured to receive the local oscillator signal of the local oscillator, and to convert an output of the second RF circuit into a predetermined intermediate-frequency signal or baseband signal, a combiner configured to combine outputs of the first and the second mixers, and an intermediate-frequency signal processing circuit configured to receive a combined output from the combiner, and to perform intermediate-frequency or baseband signal processing.

A semiconductor integrated circuit according to the present invention is a semiconductor integrated circuit which performs predetermined intermediate-frequency or baseband signal processing on a broadcast signal having a desired frequency received in an antenna circuit, including a local oscillator configured to generate a local oscillator signal having a frequency depending on the broadcast signal, a first mixer configured to receive the local oscillator signal of the local oscillator, and to convert an output of an RF circuit which amplifies or attenuates the broadcast signal received in the antenna circuit into a predetermined intermediate-frequency signal or baseband signal, a second mixer, whose input terminal is grounded through an impedance equivalent to or almost the same as an output impedance of the RF circuit, the second mixer being configured to receive the local oscillator signal of the local oscillator, and to convert a signal input to the input terminal into a predetermined intermediate-frequency signal or baseband signal, a combiner configured to combine outputs of the first and the second mixers, and an intermediate-frequency signal processing circuit configured to receive a combined output from the combiner, and to perform intermediate-frequency or baseband signal processing.

In the semiconductor integrated circuit according to the present invention, the second RF circuit is arranged in a mask layout equivalent to or almost the same as that of the first RF circuit; the second mixer has a characteristic equivalent to that of the first mixer, and is arranged in a mask layout equivalent to or almost the same as that of the first mixer; and the combiner adds the output of the second mixer to the output of the first mixer 180 degrees out of phase relative to each other.

The semiconductor integrated circuit according to the present invention further includes an amplifier-attenuator configured to limit the bandwidth of, and to amplify or attenuate, the output of the second mixer, where the combiner adds an output of the amplifier-attenuator to the output of the first mixer 180 degrees out of phase relative to each other.

In the semiconductor integrated circuit according to the present invention, the amplifier-attenuator amplifies or attenuates the output of the second mixer depending on the frequency of the broadcast signal.

A semiconductor integrated circuit according to the present invention includes a first RF circuit, coupled to an antenna circuit which receives a broadcast signal having a desired frequency, and configured to amplify or attenuate the broadcast signal, a second RF circuit whose input terminal is grounded through an impedance equivalent to or almost the same as an output impedance of the antenna circuit, and a combiner configured to combine an output of the first RF circuit with an output of the second RF circuit.

In the semiconductor integrated circuit according to the present invention, the input terminal of the second RF circuit or the second mixer is grounded in the semiconductor integrated circuit through a resistor equivalent to an output impedance of the antenna circuit or the first RF circuit.

A broadcast receiver according to the present invention includes the semiconductor integrated circuit.

Thus, according to the present invention, an RF circuit or a mixer whose input terminal is grounded through an impedance equivalent to or almost the same as the output impedance of an antenna circuit or an RF circuit outside the semiconductor integrated circuit is additionally provided to have an input impedance equivalent to that of the received signal subsystem. Accordingly, passing a spurious component equivalent to that of an output of the received signal subsystem through the RF circuit or the mixer, and detecting the spurious component, allows a combination operation so that the spurious component contained in the output of the received signal subsystem is cancelled out. Thus, the effects of noise can be further reduced.

In particular, according to the present invention, each of the RF circuit and the mixer, whose input terminal is terminated by grounding through an impedance equivalent to that of the antenna circuit, is arranged in a mask layout equivalent to or almost the same as that of the received signal subsystem, and thereby can have a parasitic element equivalent to that of the received signal subsystem. Accordingly, passing a spurious component equivalent to that contained in an output of the received signal subsystem through the RF circuit and the mixer, detecting the spurious component, and then adding the spurious component to the output of the received signal subsystem 180 degrees out of phase relative to each other, allows the spurious components to effectively cancel each other. Thus, the effects of noise can be further reduced.

In addition, according to the present invention, the additionally provided amplifier-attenuator allows the frequency range and the level of the detected spurious component to be adjusted so that the spurious component contained in the output of the received signal subsystem is substantially cancelled out. Thus, the effects of noise can be further reduced.

Moreover, according to the present invention, when the level of the spurious component is low depending on the receiving channel, the additionally provided amplifier-attenuator allows the output of the second mixer to be decreased. Thus, a side effect such as degradation in noise figure (NF) due to the output of the second mixer can be minimized.

Furthermore, according to the present invention, only the spurious component generated in the semiconductor integrated circuit, and caused to enter the RF circuit due to a parasitic element is passed through an RF circuit different from one in the received signal subsystem, and is detected. Then, the detected spurious component is combined with the output of the received signal subsystem, thereby allowing the spurious component contained in the output of the received signal subsystem to be cancelled out. Thus, the effects of the spurious component can be effectively reduced.

Still furthermore, according to the present invention, the input terminal of the RF circuit additionally provided in order to detect the spurious component can be easily grounded and terminated within the semiconductor integrated circuit using, usually, a resistor equivalent to the impedance of the received signal subsystem of several tens of ohms ($\Omega$). Thus, the effects of the spurious component can be easily reduced.

In addition, according to the present invention, since the semiconductor integrated circuit according to the present invention is used for the semiconductor integrated circuit which occupies a large portion of the receiver circuit in a broadcast receiver, a broadcast receiver in which a noise output due to spurious is reduced can be provided.

As described above, according to a semiconductor integrated circuit according to the present invention, an RF circuit or a mixer whose input terminal is grounded through an impedance equivalent to or almost the same as the output impedance of an antenna circuit or an RF circuit outside the semiconductor integrated circuit is additionally provided to have an input impedance equivalent to that of the received signal subsystem. Accordingly, a spurious component equivalent to that contained in a signal of the received signal subsystem can be detected, and thus the spurious component contained in the output signal of the received signal subsystem can be cancelled out. Thus, the present invention is advantageous in that the effects of noise can be effectively reduced.

DETAILED DESCRIPTION

Example embodiments of the present invention will be described below with reference to the drawings.

First Embodiment

Figure 1:
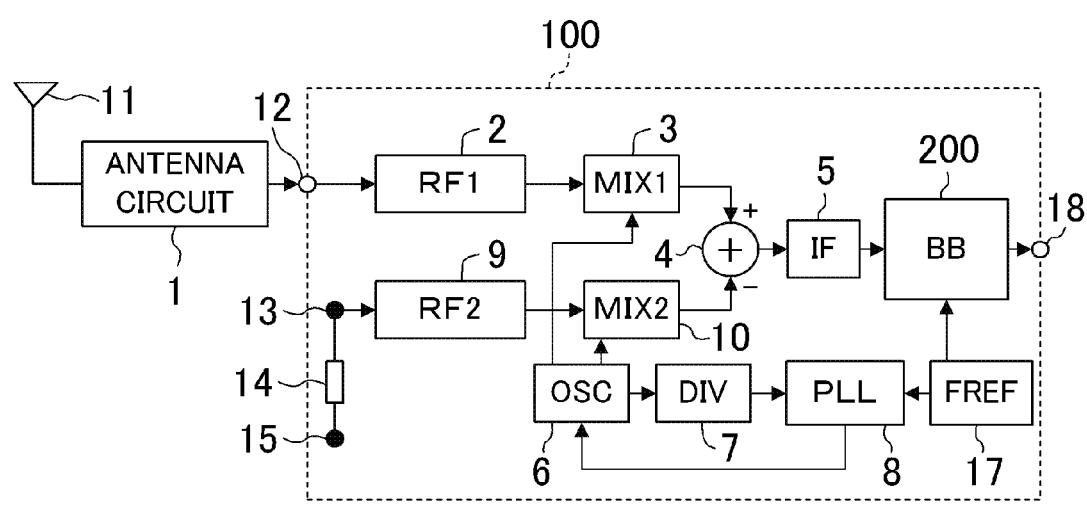
FIG. 1 is a block diagram of a semiconductor integrated circuit according to the first embodiment of the present invention.

FIG. 1 is a block diagram of a semiconductor integrated circuit according to the first embodiment of the present invention.

In FIG. 1, reference numeral 1 denotes an antenna circuit, coupled to an antenna 11, and including a tuner circuit or a filter circuit, and a matching circuit. Reference numeral 2 denotes a first RF circuit, including a low noise amplifier or a gain control amplifier etc. Reference numeral 3 denotes a first mixer; 4, an adder (combiner); 5, an IF signal processing or a baseband signal processing circuit (intermediate-frequency signal processing circuit); 6, a local oscillator circuit; 7, a frequency divider; 8, a PLL circuit; and 17, an oscillator which generates a reference frequency signal used in the PLL circuit 8 etc., and the oscillator 17 is usually implemented by a crystal oscillator. Reference numeral 12 denotes an input terminal; 18, an output terminal; 9, a second RF circuit; 10, a second mixer; 14, an impedance circuit; and 200, a digital signal processing circuit for demodulation, which demodulates a baseband signal, and outputs the result to a downstream component. Reference numeral 100 denotes an IC (semiconductor integrated circuit) chip including the component circuits described above.

Note that the digital signal processing circuit for demodulation 200 may be an analog signal processing circuit, and may be disposed on an IC chip other than the IC 100.

Figure 2:
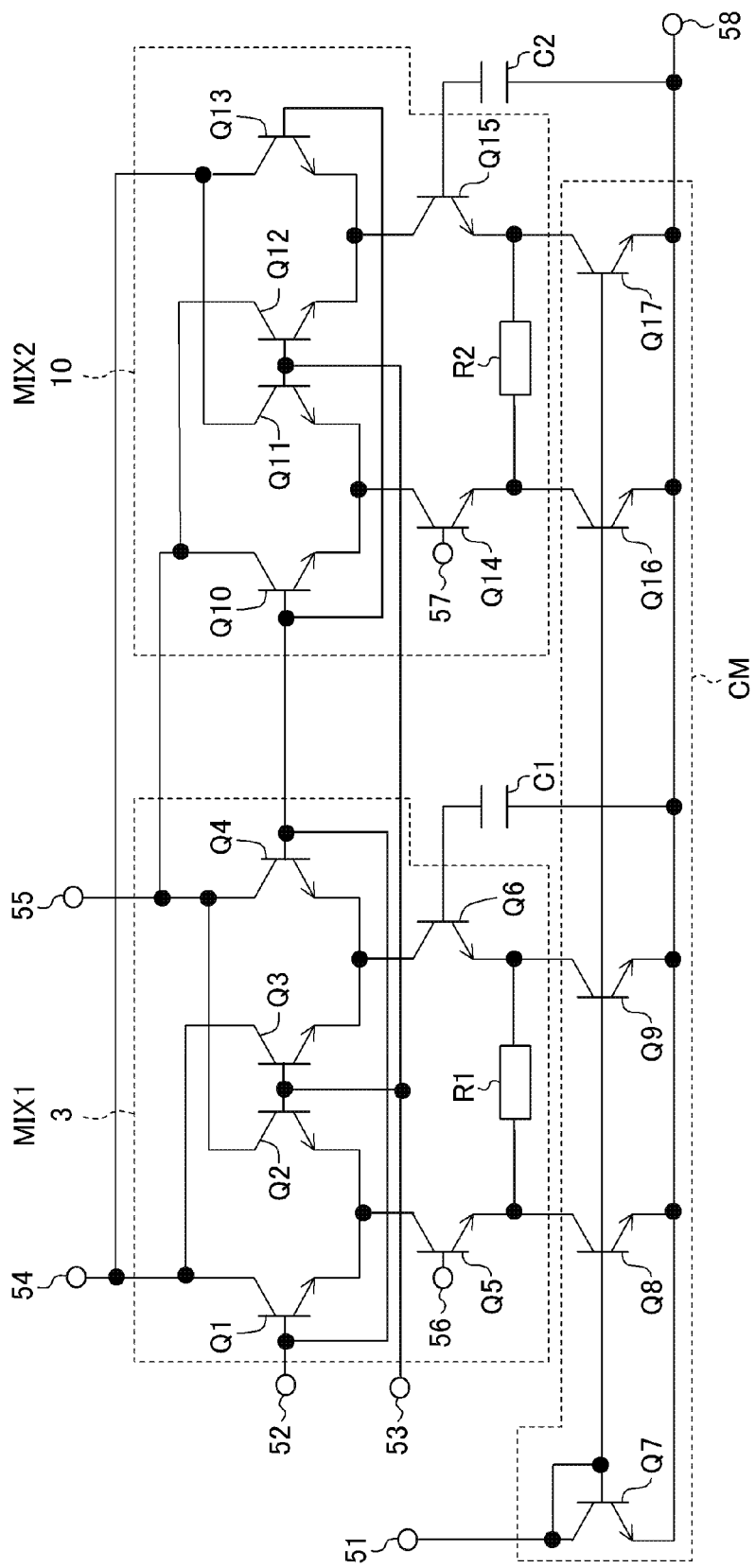
FIG. 2 is a specific circuit diagram of the mixer and the adder included in the semiconductor integrated circuit.

Next, a specific example of a circuit of the first mixer 3, the second mixer 10, and the adder 4 is illustrated in FIG. 2. In FIG. 2, reference characters Q1-Q17 denote transistors; R1 and R2, resistors; and C1 and C2, capacitors. Reference numeral 51 denotes a current input terminal; 52 and 53, local oscillator signal input terminals; 54 and 55, additive (or subtractive) output terminals for the first and the second mixers 3 and 10; 56, an input terminal of the first mixer 3; 57, an input terminal of the second mixer 10; and 58, a ground terminal.

In FIG. 2, the transistors Q1-Q6 and the resistor R1 form the first mixer 3, and the transistors Q10-Q15 and the resistor R2 form the second mixer 10. The transistors Q7, Q8, Q9, Q16, and Q17 form a current mirror circuit CM. The current mirror circuit CM is a current source to source currents to the first and the second mixers 3 and 10.

Next, the first and the second mixers 3 and 10 and the adder 4 of FIG. 2 will be described. The input terminal 56 of the first mixer 3 is coupled to the first RF circuit 2; and a received signal and, through a parasitic element, a spurious signal are input to the input terminal 56. The input received signal and the spurious signal are multiplied by the local oscillator signals input from the local oscillator signal input terminals 52 and 53, and the results are output from the additive output terminals 54 and 55. Meanwhile, the input terminal 57 of the second mixer 10 is coupled to the second RF circuit 9, and a spurious signal is input to the input terminal 57 through a parasitic element. The input spurious signal is multiplied by the local oscillator signals input from the local oscillator signal input terminals 52 and 53, and the results are output from the additive output terminals 54 and 55, 180 degrees out of phase relative to the output of the first mixer 3. Since the outputs of the first and the second mixers 3 and 10 are added together 180 degrees out of phase relative to each other, that is, are subtracted from each other, and then are output, the spurious signals cancel each other, and thus only the received signal is output.

Although, in FIG. 2, the first and the second mixers 3 and 10 are shown by way of example in a form of multipliers using bipolar transistors, a configuration using field effect transistors (FETs) may, of course, also be used.

The operation of the semiconductor integrated circuit configured as described above will be described below.

In FIG. 1, a received broadcast signal is input to the antenna circuit 1, in which a desired frequency is selected and unwanted signals are filtered out, and then the received signal is input through the input terminal 12 to the IC 100. The input received signal is amplified or attenuated in the first RF circuit 2, and then is input to the first mixer 3. The first mixer 3 extracts an IF signal having a desired signal bandwidth from an output from the local oscillator circuit 6 and from the received signal, and inputs the IF signal to the IF signal processing circuit 5. The digital signal processing circuit for demodulation 200 produces a video or audio signal etc. by demodulation. Although the intermediate frequency is usually set to an out-of-baseband bandwidth frequency, the first mixer 3 may directly generate a baseband signal. The present invention can treat the both methods in a similar way.

Figure 3:
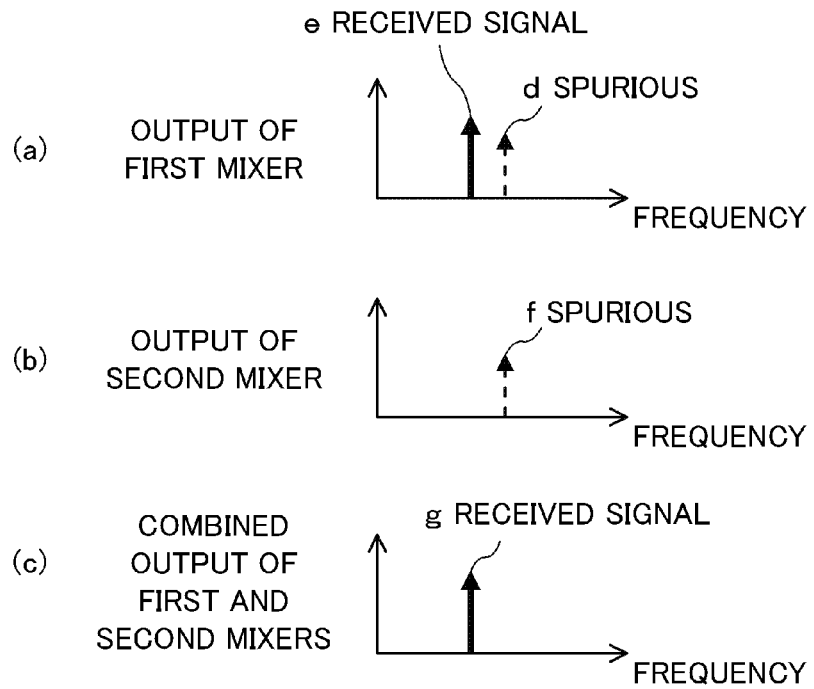
FIG. 3A is a diagram illustrating the output signal components of the first mixer included in the semiconductor integrated circuit.
FIG. 3B is a diagram illustrating the output signal component of the second mixer included in the semiconductor integrated circuit.
FIG. 3C is a diagram illustrating the signal component of the combined output of the two mixers.

An output, containing a spurious component, of the first mixer 3 will now be described using the example of FIG. 3A. As shown in FIG. 3A, the first mixer 3 receives, in addition to the received signal input from the antenna circuit 1, an unwanted noise component (spurious component) generated in the IC 100 through a parasitic element. The spurious component is amplified and mixed together with the received signal to generate an IF signal, and the IF signal is demodulated in the digital signal processing circuit for demodulation 200; thus, the reception characteristic is affected. FIG. 3A, in which the horizontal axis represents the frequency, and the vertical axis represents the output of the first mixer 3, shows that a spurious component "d" is provided in addition to the proper received signal "e." Major noise sources include harmonic components contained in the output of the crystal oscillator 17 and noise from the logic circuit having a wide frequency range.

In FIG. 1, the input terminal of the second RF circuit 9 is grounded though an impedance 14 equivalent to the output impedance of the antenna circuit 1. The output impedance of the antenna circuit 1 is usually set to several tens of ohms (Ω), such as 50Ω or 75Ω; therefore, the input terminal of the second RF circuit 9 can be easily configured in the IC 100 by grounding the input terminal within the IC 100 using a resistor equivalent to several tens of ohms as the impedance circuit 14. The output of the second RF circuit 9 is coupled to the second mixer 10, and the output of the second mixer 10 is input to the adder (combiner) 4, where the output of the second mixer 10 is added to the output of the first mixer 3.

Since the input terminal of the second RF circuit 9 is grounded, the received signal is not input thereto. Meanwhile, the input terminal is connected to the impedance equivalent to the input impedance of the first RF circuit 2, and thus the impedance at the input terminal is equivalent to the input impedance of the first RF circuit 2. Accordingly, an unwanted noise component of a same level as that of the first RF circuit 2 generated in the IC 100 is input to the second RF circuit 9, and the output of the second RF circuit 9 is output to the second mixer 10. As shown in FIG. 3B, the output of the second mixer 10 has only a spurious component "f." Since the output of the first mixer 3 has both the received signal component "e" and the unwanted noise component "d" as shown in FIG. 3A, and the output of the second mixer 10 has only the unwanted noise component "f," only the received signal component "g" is output to the IF signal processing circuit 5 as shown in FIG. 3C, by combining the output of the first mixer 3 with the output of the second mixer 10 in the adder 4 so that the unwanted noise component is cancelled out. Thus, the noise component due to spurious is reduced.

Note that an increase of the circuit size from a conventional size due to usage of the second RF circuit 9 and the second mixer 10 for achieving the above configuration does not result in a significant cost increase, because the increase in chip size is small relative to the entire IC size owing to reduced size and higher integration density achieved by the advancement of semiconductor technologies.

(Variation)

Figure 4:
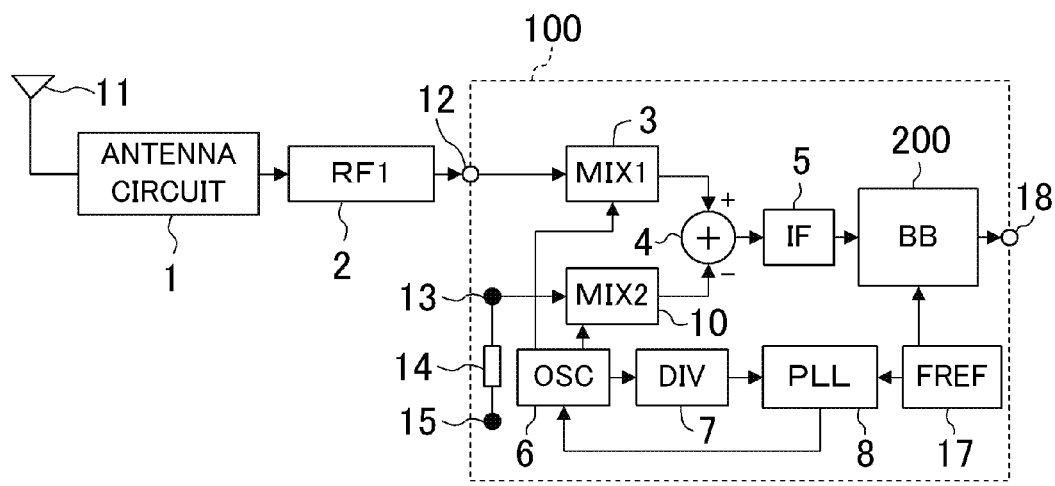
FIG. 4 is a block diagram of a semiconductor integrated circuit of a variation of the first embodiment.

FIG. 4 illustrates a variation of the semiconductor integrated circuit of the first embodiment.

In the configuration shown in FIG. 4, the first RF circuit 2 of FIG. 1 is not included in the IC 100. In this variation, since the first RF circuit 2 is not included in the IC 100, the second RF circuit 9 required in the first embodiment of FIG. 1 is not required. Thus, in the first embodiment, the input terminal of the second RF circuit 9 is grounded through the impedance equivalent to the output impedance of the antenna circuit 1, while in this variation, the input terminal of the second mixer 10 is terminated by grounding through an impedance equivalent to the output impedance of the first RF circuit 2. Thus, a similar effect of canceling spurious component to that of the first embodiment is provided.

Second Embodiment

Next, a semiconductor integrated circuit according to the second embodiment of the present invention will be described.

Figure 5:
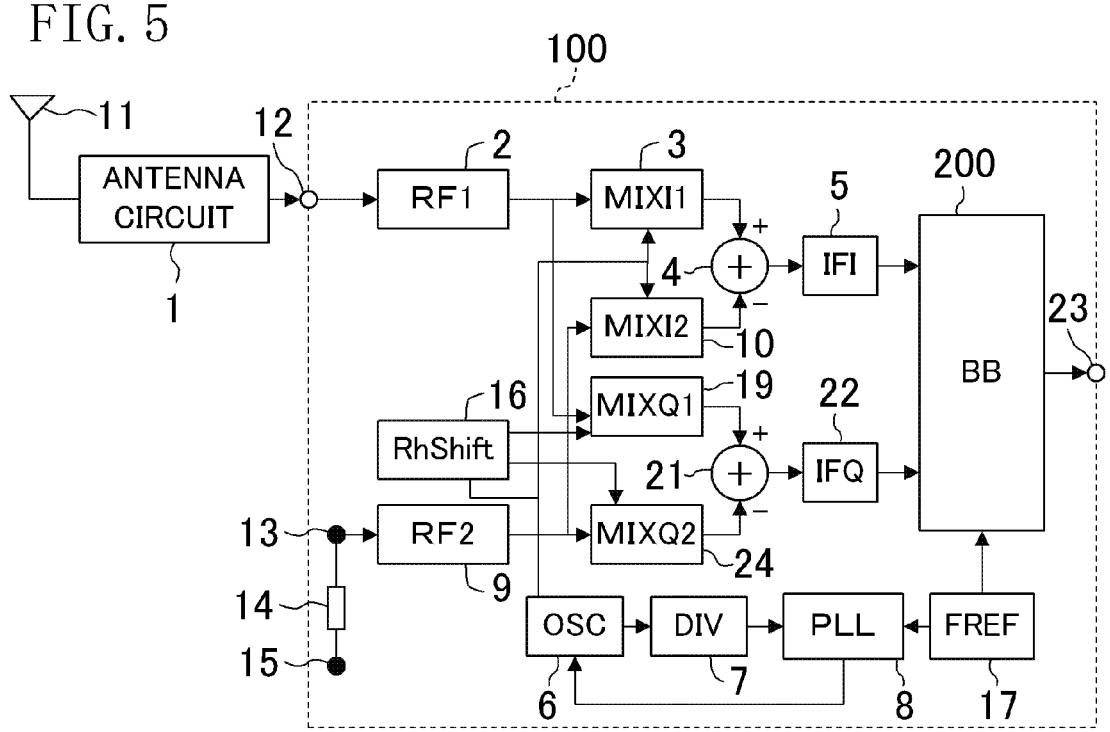
FIG. 5 is a block diagram of a semiconductor integrated circuit according to the second embodiment of the present invention.

FIG. 5 is a block diagram of a semiconductor integrated circuit of a quadrature demodulation receiver according to this embodiment.

In FIG. 5, reference numeral 3 denotes a first I-mixer for an in-phase (I) signal; 19, a first Q-mixer for a quadrature (Q) signal; 10, a second I-mixer for spurious component detection for the I signal; 24, a second Q-mixer for spurious component detection for the Q signal; 16, a ninety-degree phase shifter; 4 and 21, adders: 5, an I-IF signal processing circuit for the I signal; 22, a Q-IF signal processing circuit for the Q signal; and 200, a digital signal processing circuit for demodulation, which demodulates the I and Q signals to produce a video and an audio signals. The same reference numerals as those shown in FIG. 1 are used to represent other elements having equivalent functions, and the explanation thereof will be omitted.

The operation of the semiconductor integrated circuit configured as described above will be described below.

In FIG. 5, the antenna circuit 1 selects a desired frequency from a received broadcast signal, and filters out unwanted signals. The resultant signal is then input through the input terminal 12 to the IC 100. The input received signal is amplified or attenuated in the first RF circuit 2, and then is input to the first I-mixer 3 and the first Q-mixer 19. The first I-mixer 3 and the first Q-mixer 19 extract I- and Q-IF signals, each having a desired signal bandwidth, from a local oscillator output from the local oscillator circuit 6, from a local oscillator output which is phase shifted by ninety degrees, and from the received signal, and then input the I- and Q-IF signals respectively to the I-IF signal processing circuit 5 and the Q-IF signal processing circuit 22. The digital signal processing circuit for demodulation 200 produces a video or audio signal etc. by demodulation.

Here, as described above and as show in FIG. 3A, the outputs of the first RF circuit 2, of the first I-mixer 3, and of the first Q-mixer 19 contain, in addition to the received signal "e" input from the antenna circuit 1, an unwanted noise component (spurious component) "d" generated in the IC 100.

The input terminal of the second RF circuit 9 is grounded through an impedance equivalent to the output impedance of the antenna circuit 1, and an impedance equivalent to that of the first RF circuit 2 is connected to the input terminal, and thus the impedance at the input terminal is equivalent to the input impedance of the first RF circuit 2. Accordingly, only the unwanted noise component (spurious component) "f" of a same level as that of the first RF circuit 2 (see FIG. 3B) generated in the IC 100 is input to the second RF circuit 9. The output of the second RF circuit 9 is input to the second I-mixer 10 and to the second Q-mixer 24. The output of the second I-mixer 10 is input to the adder 4, and is added to the output of the first I-mixer 3; and the output of the second Q-mixer 24 is input to the adder 21, and is added to the output of the first Q-mixer 19. Accordingly, as shown in FIG. 3C, only the received signal component "g" is output at each of the outputs of the adders 4 and 21, and is input to each of the I-IF signal processing circuit 5 and the Q-IF signal processing circuit 22. Thus, the noise component due to spurious is effectively reduced.

Third Embodiment

Next, a semiconductor integrated circuit according to the third embodiment of the present invention will be described.

Figure 6:
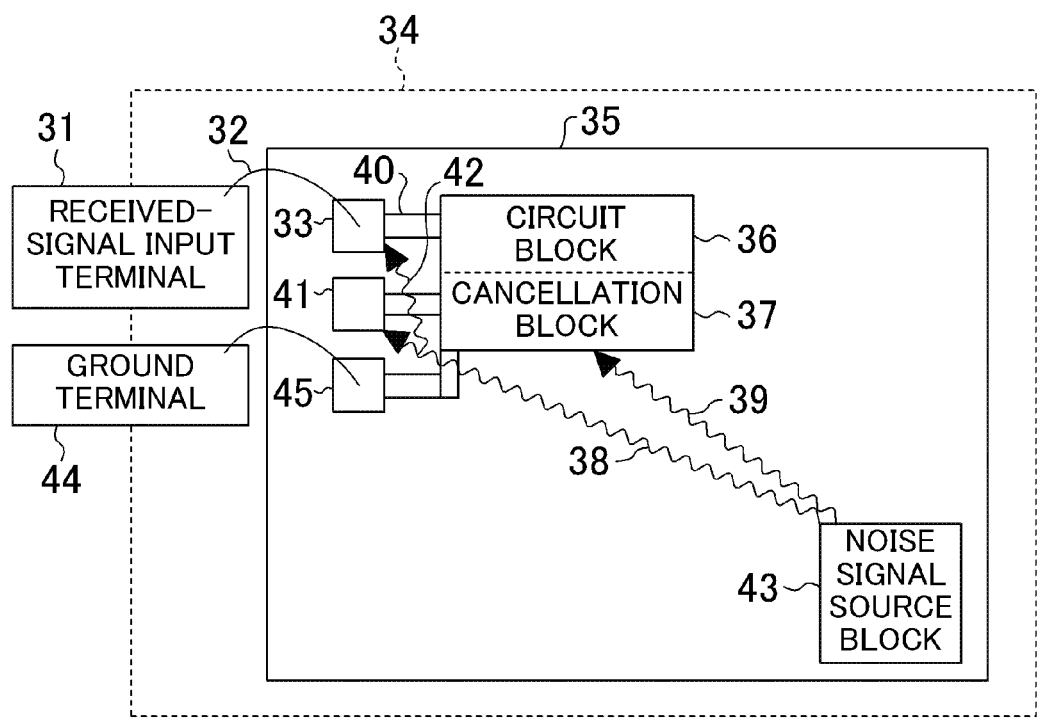
FIG. 6 is a diagram illustrating a chip layout of a semiconductor integrated circuit according to the third embodiment of the present invention.

The circuit configuration of the semiconductor integrated circuit of this embodiment is the same as that shown in FIG. 1 except for the chip layout in the IC 100 as shown in FIG. 6.

In FIG. 6, reference numeral 37 denotes a cancellation block including the second RF circuit 9 and the second mixer 10. The cancellation block 37 is configured and arranged using devices equivalent to those of a circuit block 36, including the first RF circuit 2 and the first mixer 3, in a mask layout equivalent to or almost the same as that of the circuit block 36, so as to have a characteristic equivalent thereto. Reference numeral 41 denotes a bonding pad connected to the input terminal of the second RF circuit 9. In FIG. 6, although the first RF circuit 2 and the first mixer 3 are shown as being arranged in a same block layout, and the second RF circuit 9 and the second mixer 10 are shown as being arranged in a same block layout, the combination of these elements are not limited thereto, but another layout is acceptable such that these elements are arranged in a same block (for example, the component transistors etc. of the first RF circuit 2 and the second RF circuit 9 are arranged in a same block), and the parasitic components from the noise source are equivalent.

Thus, according to this embodiment, the second RF circuit 9 included in the cancellation block 37 is grounded through the impedance 14 equivalent to the output impedance of the antenna circuit 1 as shown in FIG. 1; therefore, the unwanted noise component (spurious component) "f" of a same level as that of the first RF circuit 2 generated in the IC 100 is detected. In addition, since the layout of the second RF circuit 9 is equivalent to the layout of the first RF circuit 2, spurious noise components from the noise source block 43 are coupled through parasitic elements equivalent to each other. Therefore, detection of the spurious component "f" which is almost the same as the spurious component "d" contained in the output signal of the received signal subsystem allows the detected spurious component "f" to effectively cancel out the spurious noise "d."

Note that since the block including both the first RF circuit 2 and the first mixer 3 and the block including both the second RF circuit 9 and the second mixer 10 have parasitic components from the noise source equivalent to each other, the additive operation in the adder 4 does not require a combination operation in which the phase difference between the both outputs is taken into account.

Fourth Embodiment

Next, a semiconductor integrated circuit according to the fourth embodiment of the present invention will be described.

Figure 7:
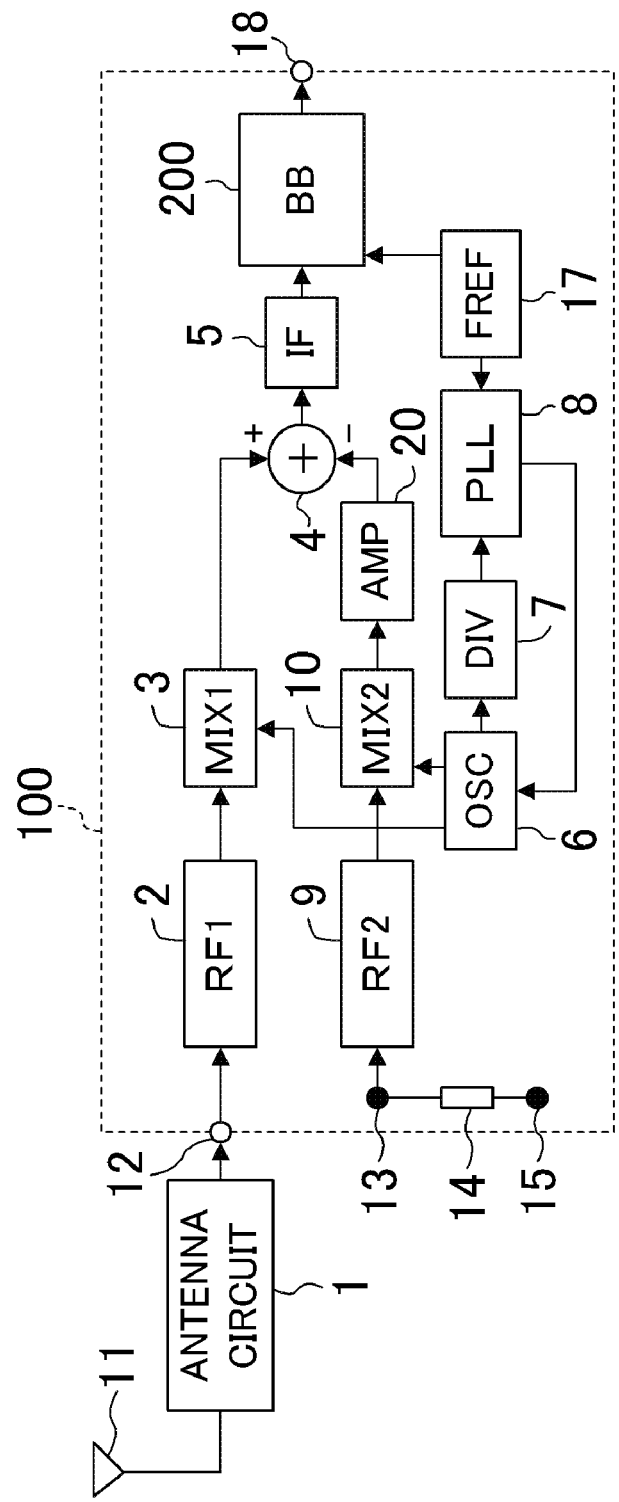
FIG. 7 is a block diagram of a semiconductor integrated circuit according to the fourth embodiment of the present invention.

The semiconductor integrated circuit of this embodiment is shown in FIG. 7. In FIG. 7, the semiconductor integrated circuit is different from that shown in FIG. 1 in that an amplifier-attenuator 20 is additionally provided. The other part of the configuration is the same as that of FIG. 1; thus, the same reference numerals are used to represent equivalent elements, and the explanation thereof will be omitted.

The amplifier-attenuator 20 is provided downstream of the second mixer 10, and amplifies or attenuates an output of the second mixer 10. Since, as shown in FIG. 3B, the output of the second mixer 10 is the spurious component "f," the amplifier-attenuator 20 amplifies or attenuates the level of the spurious component "f" detected by the second mixer 10 so that the spurious component "d" of FIG. 3A contained in the output signal of the received signal subsystem from the first mixer 3 is exactly cancelled out by the spurious component "f" in the adder 4.

In addition, the amplifier-attenuator 20 limits the passband of the output signal from the second mixer 10 to the frequency range within which the spurious signal falls. Accordingly, no noise components other than the spurious signal are added to the output of the first mixer 3 in the adder 4, and thus more efficient cancellation of the spurious signal can be achieved.

Moreover, the amplifier-attenuator 20 attenuates the output of the second mixer 10 depending on the frequency of the received broadcast signal. In general, RF circuits and mixers are themselves noise sources; therefore, connection of the second RF circuit 9 and the second mixer 10 for cancellation of the spurious signal may induce a degradation in the reception characteristic depending on the location. Since the frequency dependence of the noise component due to spurious causes a variation in the noise level across reception channels, there is a channel whose noise component is negligible. With this regard, the output signal of the second mixer 10 is attenuated so that the amount of cancellation is small or zero during reception on a channel whose noise component is negligible. Thus, the effects of noise generated in the second RF circuit 9 and the second mixer 10 can be minimized.

Note that, also in the second and the fourth embodiments, if the first RF circuit 2 is not provided in the IC 100 similarly to the variation of the first embodiment, the second RF circuit 9 is no more needed. Therefore, a variation in which the input terminal of the second mixer 10 is terminated by grounding through an impedance circuit 14 equivalent to the output impedance of the first RF circuit 2, of course, has an effect of canceling the spurious component.

Fifth Embodiment

Next, a semiconductor integrated circuit according to the fifth embodiment of the present invention will be described using FIG. 8.

Figure 8:
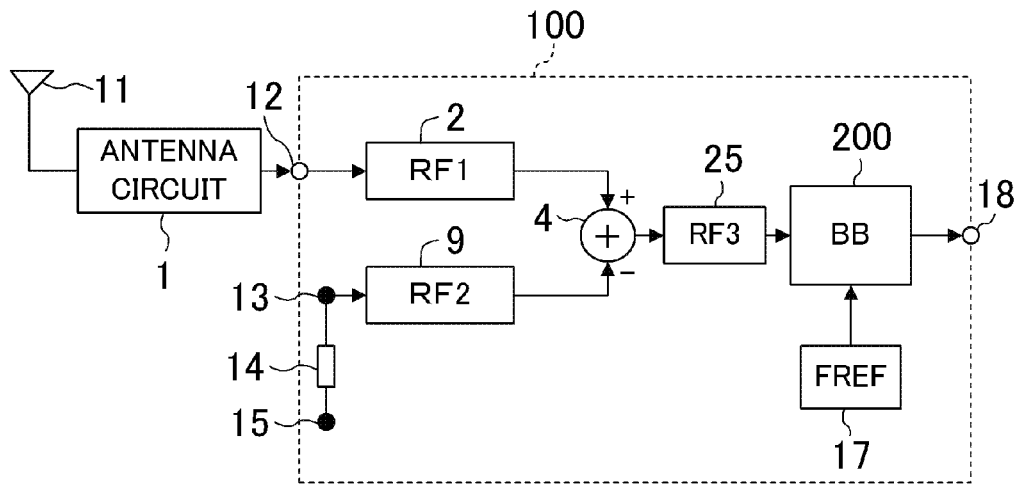
FIG. 8 is a block diagram of a semiconductor integrated circuit according to the fifth embodiment of the present invention.
Figure 9:
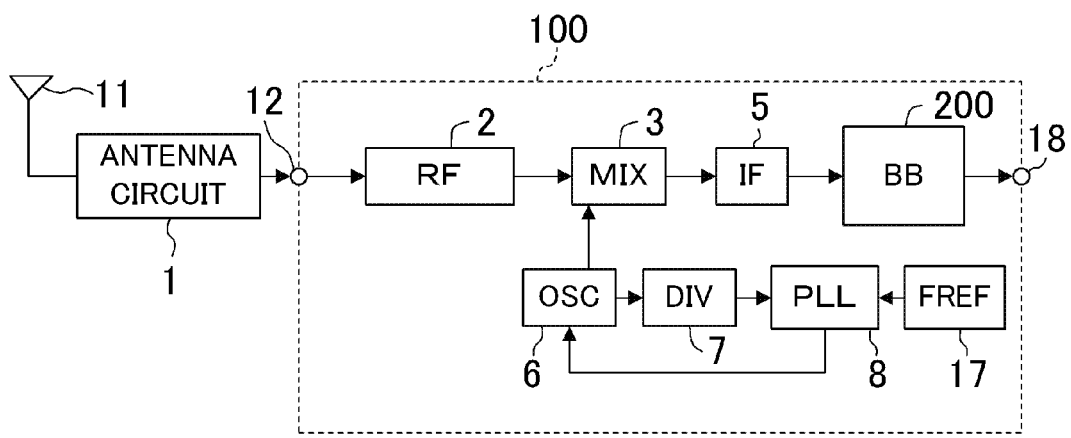
FIG. 9 is a block diagram of a conventional semiconductor integrated circuit.
Figure 10:
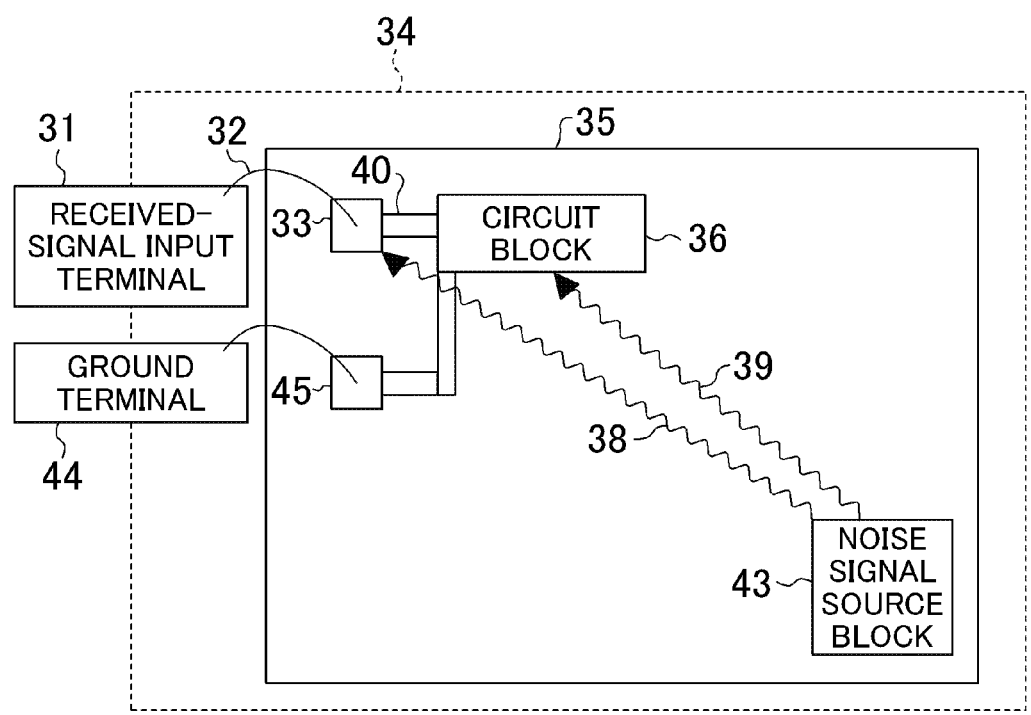
FIG. 10 is a diagram illustrating a chip layout of a conventional semiconductor integrated circuit.

The semiconductor integrated circuit shown in FIG. 8 is an example of one having a configuration different from that shown in FIG. 1 in that the first mixer 3 and the IF signal processing circuit 5 are not provided, and thus the received signal from the antenna circuit 1 is not converted into an IF signal.

Accordingly, the semiconductor integrated circuit of FIG. 8 does not include the first mixer 3, the IF signal processing circuit 5, the local oscillator circuit 6, the frequency divider 7, the PLL circuit 8, nor the oscillator 17 shown in FIG. 1. In FIG. 8, a third RF circuit 25 is additionally provided which has functions to amplify or attenuate, and to limit the bandwidth of, the output of the adder 4. The other part of the configuration is the same as that of FIG. 1; thus, the explanation thereof will be omitted.

The operation of the semiconductor integrated circuit of this embodiment will be described below.

In FIG. 8, the antenna circuit 1 selects a desired frequency from a received broadcast signal, and filters out unwanted signals. The resultant signal is then input through the input terminal 12 to the IC 100. The input received signal is amplified or attenuated in the first RF circuit 2, and then is input through the adder (combiner) 4 to the third RF circuit 25. The third RF circuit 25 amplifies or attenuates, and limits the bandwidth of, the output of the adder 4, and then, the digital signal processing circuit for demodulation 200 provided downstream thereof produces a video or audio signal etc. by demodulation. This configuration is used for a system in which an analog received signal is converted into a digital signal without using an IF signal, and demodulation is performed in the digital signal processing circuit for demodulation 200. This configuration is implemented in receivers for broadcasts using low broadcast frequencies such as AM broadcasts.

Thus, also in this embodiment, the first RF circuit 2 may receive, in addition to the received signal input from the antenna circuit 1, an unwanted noise component (spurious component) "d" generated in the IC 100 through a parasitic element; thus, the reception characteristic may be affected. On the other hand, the input terminal of the second RF circuit 9 is grounded through an impedance circuit 14 equivalent to the output impedance of the antenna circuit 1, and the impedance at the input terminal of the second RF circuit 9 is equivalent to that of the first RF circuit 2; thus, the second RF circuit 9 outputs only the unwanted noise component (spurious component) "f" of a same level as that of the first RF circuit 2 generated in the IC 100. Therefore, addition and combination of the both output signals in the adder 4 causes the two spurious components "d" and "f" to cancel each other; accordingly, only the received signal component "g" is output to the third RF circuit 25. Thus, the noise component due to spurious is effectively reduced.

The semiconductor integrated circuits described above are used in, for example, broadcast receivers. In a broadcast receiver, most of its components, such as an RF circuit, a mixer, a local oscillator, and a demodulator, tend to be included in a same semiconductor integrated circuit; thus, the reception characteristic increasingly depends on the semiconductor integrated circuit used. Accordingly, configuring a broadcast receiver using a semiconductor integrated circuit according to any of the presented embodiments achieves a broadcast receiver having a superior reception characteristic owing to reduction in noise due to spurious.

As described above, the present invention is advantageous for receivers etc. in terms of reducing spurious of semiconductor integrated circuits including high frequency circuits, and is most useful for broadcast receivers in which noise due to spurious is reduced.

What is claimed is:

1. A semiconductor integrated circuit, comprising:
a first RF circuit, coupled to an antenna circuit which receives a broadcast signal having a desired frequency, and configured to amplify or attenuate the broadcast signal;
a local oscillator configured to generate a local oscillator signal having a frequency depending on the broadcast signal;
a first mixer configured to receive the local oscillator signal of the local oscillator, and to convert an output of the first RF circuit into a predetermined intermediate-frequency signal or baseband signal;
a second RF circuit whose input terminal is grounded through an impedance equivalent to or almost the same as an output impedance of the antenna circuit;
a second mixer configured to receive the local oscillator signal of the local oscillator, and to convert an output of the second RF circuit into a predetermined intermediate-frequency signal or baseband signal;
a combiner configured to combine outputs of the first and the second mixers; and
an intermediate-frequency signal processing circuit configured to receive a combined output from the combiner, and to perform intermediate-frequency or baseband signal processing.

2. A semiconductor integrated circuit which performs predetermined intermediate-frequency or baseband signal processing on a broadcast signal having a desired frequency received in an antenna circuit, comprising:
a local oscillator configured to generate a local oscillator signal having a frequency depending on the broadcast signal;
a first mixer configured to receive the local oscillator signal of the local oscillator, and to convert an output of an RF circuit which amplifies or attenuates the broadcast signal received in the antenna circuit into a predetermined intermediate-frequency signal or baseband signal;
a second mixer, whose input terminal is grounded through an impedance equivalent to or almost the same as an output impedance of the RF circuit, the second mixer being configured to receive the local oscillator signal of the local oscillator, and to convert a signal input to the input terminal into a predetermined intermediate-frequency signal or baseband signal;
a combiner configured to combine outputs of the first and the second mixers; and an intermediate-frequency signal processing circuit configured to receive a combined output from the combiner, and to perform intermediate-frequency or baseband signal processing.

3. The semiconductor integrated circuit of claim 1, wherein
the second RF circuit is arranged in a mask layout equivalent to or almost the same as that of the first RF circuit,
the second mixer has a characteristic equivalent to that of the first mixer, and is arranged in a mask layout equivalent to or almost the same as that of the first mixer, and
the combiner adds the output of the second mixer to the output of the first mixer 180 degrees out of phase relative to each other.

4. The semiconductor integrated circuit of claim 1, further comprising:
an amplifier-attenuator configured to limit the bandwidth of, and to amplify or attenuate, the output of the second mixer,
wherein
the combiner adds an output of the amplifier-attenuator to the output of the first mixer 180 degrees out of phase relative to each other.

5. The semiconductor integrated circuit of claim 4, wherein
the amplifier-attenuator amplifies or attenuates the output of the second mixer depending on the frequency of the broadcast signal.

6. A semiconductor integrated circuit, comprising:
a first RF circuit, coupled to an antenna circuit which receives a broadcast signal having a desired frequency, and configured to amplify or attenuate the broadcast signal;
a second RF circuit whose input terminal is grounded through an impedance equivalent to or almost the same as an output impedance of the antenna circuit; and
a combiner configured to combine an output of the first RF circuit with an output of the second RF circuit.

7. The semiconductor integrated circuit of claim 1, wherein
the input terminal of the second RF circuit is grounded in the semiconductor integrated circuit through a resistor equivalent to an output impedance of the antenna circuit.

8. A broadcast receiver, comprising:
the semiconductor integrated circuit of claim 1.

* * * * *